United States Patent
Zhang et al.

(10) Patent No.: US 6,168,975 B1
(45) Date of Patent: Jan. 2, 2001

(54) METHOD OF FORMING EXTENDED LEAD PACKAGE

(75) Inventors: Tong Long Zhang; John Briar, both of Singapore (SG)

(73) Assignee: ST Assembly Test Services PTE LTD, Singapore (SG)

( * ) Notice: Under 35 U.S.C. 154(b), the term of this patent shall be extended for 0 days.

(21) Appl. No.: 09/104,031

(22) Filed: Jun. 24, 1998

(51) Int. Cl.$^7$ .................... H01L 21/44; H01L 23/495
(52) U.S. Cl. .................... 438/111; 438/123; 257/676
(58) Field of Search ................ 438/6, 55, 64, 438/98, 106, 111, 118, 122, 123, 124, 125, 127, 612, FOR 377, FOR 380, FOR 366, FOR 367; 257/659, 675, 753, 676

(56) References Cited

U.S. PATENT DOCUMENTS

| | | | |
|---|---|---|---|
| 4,132,856 | * 1/1979 | Hutchison et al. | 174/52 PE |
| 4,246,693 | * 1/1981 | Onuki et al. | 438/106 |
| 4,631,805 | * 12/1986 | Olsen et al. | 438/123 |
| 4,906,802 | * 3/1990 | Castleman | 174/52.4 |
| 5,122,858 | * 6/1992 | Mahulikar et al. | 257/753 |
| 5,161,304 | * 11/1992 | Queyssac et al. | 29/827 |
| 5,428,248 | * 6/1995 | Cha | 257/676 |
| 5,442,233 | * 8/1995 | Anjoh et al. | 257/675 |
| 5,486,720 | * 1/1996 | Kierse | 257/659 |
| 5,583,378 | 12/1996 | Marrs et al. | 257/710 |
| 5,598,034 | 1/1997 | Wakefield | 257/706 |
| 5,638,596 | 6/1997 | McCormick | 29/827 |
| 5,700,697 | 12/1997 | Dlugokecki | 437/8 |
| 5,770,888 | * 6/1998 | Song et al. | 257/696 |
| 5,824,568 | * 10/1998 | Zechman | 438/112 |
| 5,882,955 | * 3/1999 | Huang et al. | 438/111 |
| 5,929,514 | * 7/1999 | Yalamanchili | 257/676 |

* cited by examiner

Primary Examiner—Charles Bowers
Assistant Examiner—Brook Kebede
(74) Attorney, Agent, or Firm—George O. Saile; Stephen B. Ackerman; Larry J. Prescott

(57) ABSTRACT

This invention provides an extended lead package and method of forming the extended lead package for electronic circuit packages. A lead frame having extended leads is used. The extended leads extend under the bottom side of an integrated circuit element or chip. The bottom side of the chip is attached to the extended leads using bonding material which is a thermal conductor and an electrical insulator. Electrical connections between the chip input/output pads and the leads are provided by wire bonds using standard wire bonding techniques. The bonding material can be a tape having adhesive on one or both sides which attaches the chip to the lead frame using mechanical pressure, and/or other means such as curing or the addition of heat. Thermal energy is removed from the package by the thermal conduction path provided by the bonding material. The completed assembly can be encapsulated using standard methods.

10 Claims, 3 Drawing Sheets

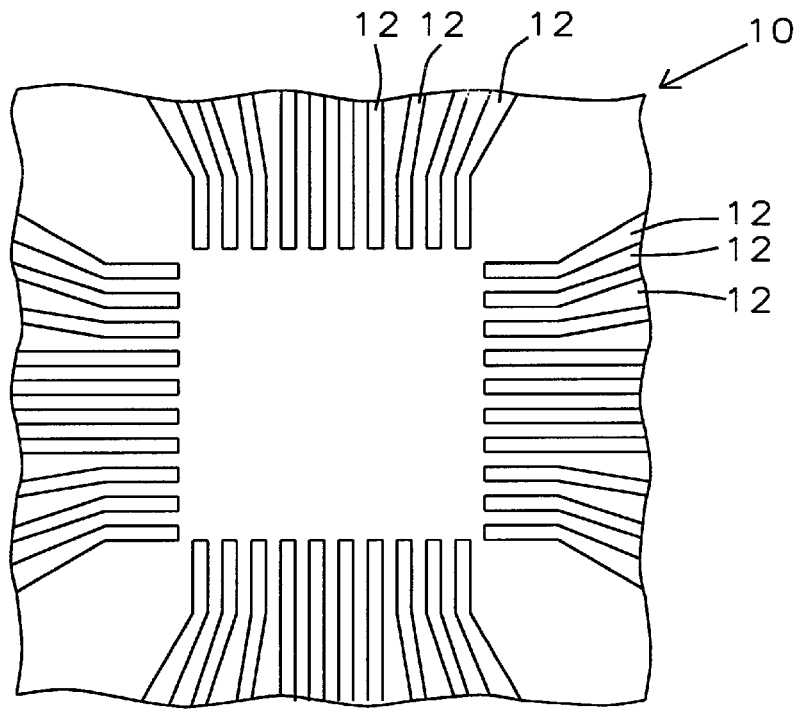
FIG. 1 – Prior Art
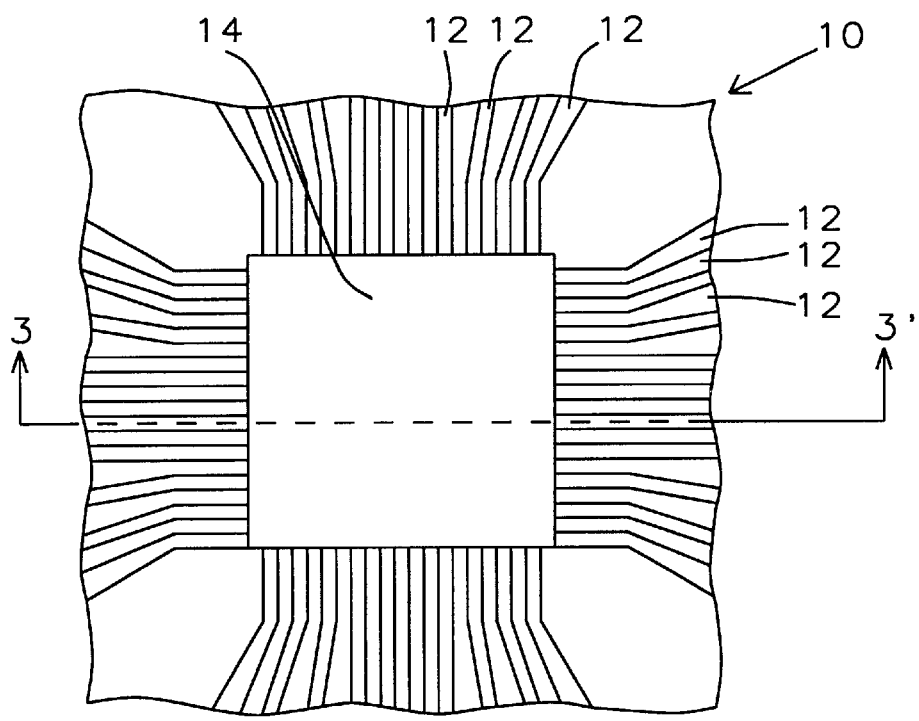
FIG. 2 – Prior Art

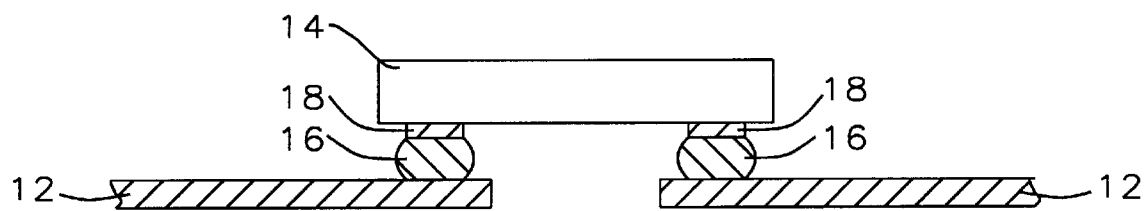
FIG. 3 – Prior Art
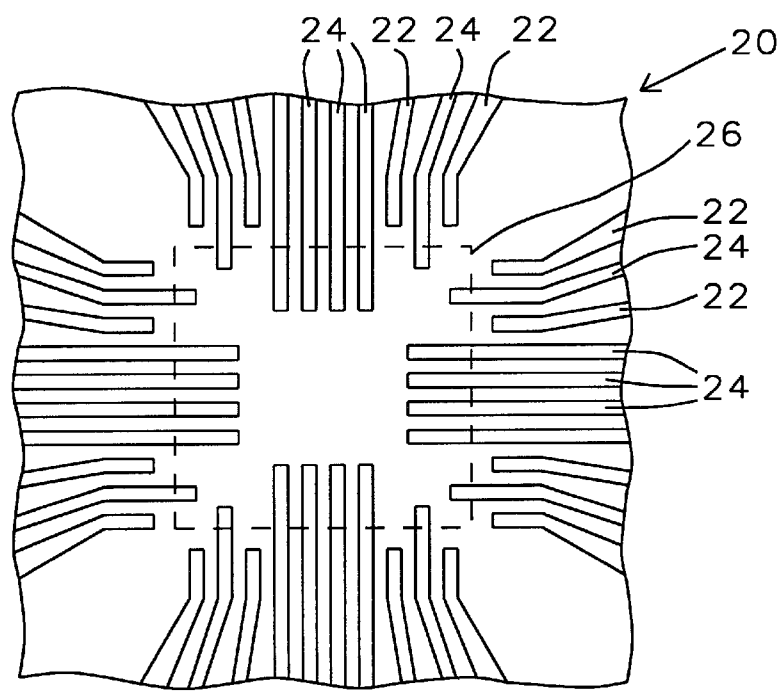
FIG. 4

METHOD OF FORMING EXTENDED LEAD PACKAGE

BACKGROUND OF THE INVENTION (1) Field of the Invention

This invention relates to electrical connection and mechanical attachment of an integrated circuit element and the leads of a lead frame and more particularly to a lead frame having extended leads.

(2) Description of the Related Art

Conventional lead frames are attached to the input/output pads of integrated circuit chips. These interconnections provide electrical connection but do not provide a significant thermal conduction path for removing heat energy from the chip.

U.S. Pat. No. 5,583,378 to Marrs et al. describes an integrated circuit package having a ball grid array and includes a thermal conductor.

U.S. Pat. No, 5,598,034 to Wakefield describes a plastic package for integrated circuit chips which includes thermally conductive heat transfer bodies to extend from the circuit chip to or near the surface of the package.

U.S. Pat. No. 5,700,697 to Dlugokecki describes a reconstructed package for an integrated circuit chip.

U.S. Pat. No. 5,638,596 to McCormick describes an electronic circuit package having a number of conductive layers and employing a lead frame.

SUMMARY OF THE INVENTION

Lead frames are frequently used to make electrical connection to integrated circuit chips because they are low cost and a number of techniques to join the lead frame to the integrated circuit chip input/output pads are available. A typical lead frame 10 is shown in FIG. 1 which shows the conductive leads 12 in a form factor which will provide for easy interconnection to the integrated circuit chip. FIG. 2 shows a plan view of the integrated circuit chip 14 joined to the conductive leads 12 of the lead frame 10. FIG. 3 shows a cross section view of the chip 14 joined to the lead 12 of the lead frame. The input/output pads 18 of the chip 14 are joined to the conductive leads 12 of the lead frame by a metal pad 16 such as a solder pad, or the like. The assembly is then encapsulated.

One of the problems with this method of making interconnection to the chip is the problem of removal of heat generated by the electrical operation of the chip. Often a thermal conduction path must be provided by attaching a heat spreader or slug to the back of the chip, not shown, to remove heat energy from the chip resulting in added cost and processing complexity.

It is a principle objective of this invention to provide a method of attaching an integrated circuit chip to a lead frame which will provide added thermal conduction to remove heat energy from the chip.

It is another principle objective of this invention to provide a package comprising an integrated circuit chip attached to a lead frame which will provide added thermal conduction to remove heat energy from the chip.

These objectives are achieved by using an extended lead package. In the extended lead package all or any number of the leads of the lead frame have added length and the leads extend under the back side of chip. The chip is supported by the leads with added length. The back side of the chip is bonded to the extended leads using a bonding material which provides thermal conductivity but is an electrical insulator. Wire bonds are then used to make electrical connection between the input/output pads of the chip and the leads of the lead frame. The extended leads bonded to the back side of the chip provide a thermal conduction path to remove heat energy from the chip. The assembly can then be encapsulated using standard encapsulation techniques.

BRIEF DESCRIPTION OF THE DRAWINGS

FIG. 1 shows a top view of a conventional lead frame.

FIG. 2 shows a top view of a conventional lead frame with an integrated circuit chip attached.

FIG. 3 shows a cross section view of a conventional lead frame chip assembly taken along line 3—3' of FIG. 2.

FIG. 4 shows a top view of the extended lead frame of this invention.

DESCRIPTION OF THE PREFERRED EMBODIMENTS

Figure 5:
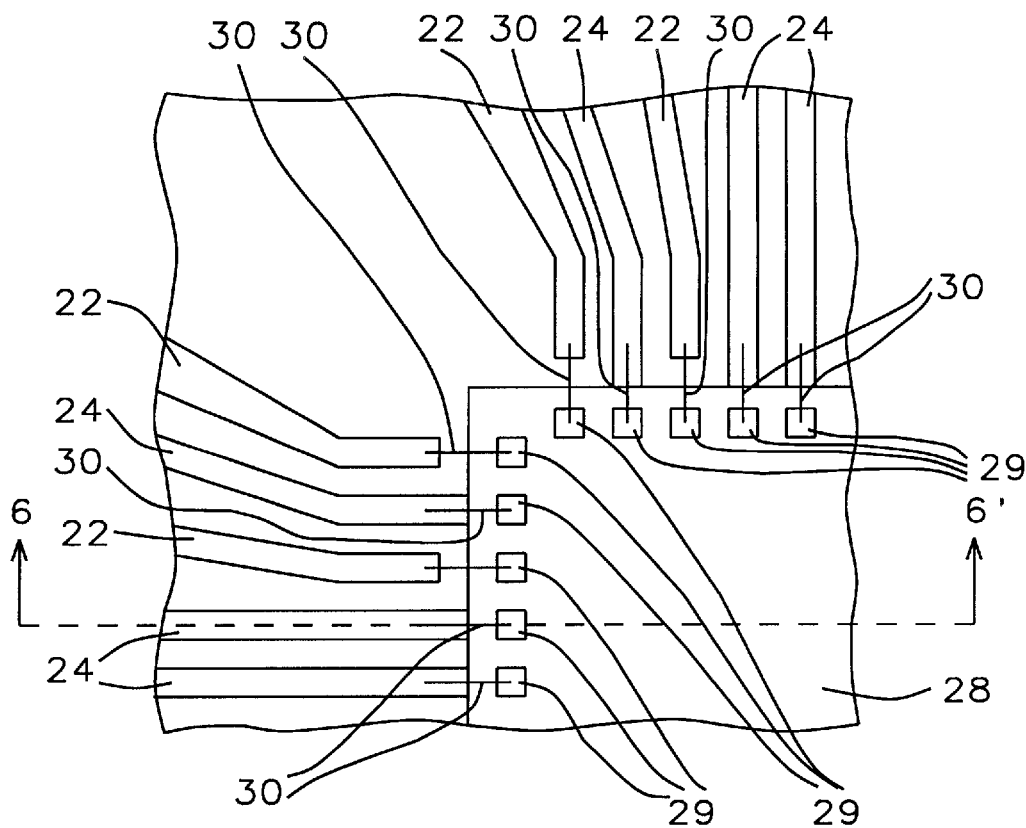
FIG. 5 shows a top view of an integrated circuit chip joined to the extended lead frame of this invention.
Figure 6:
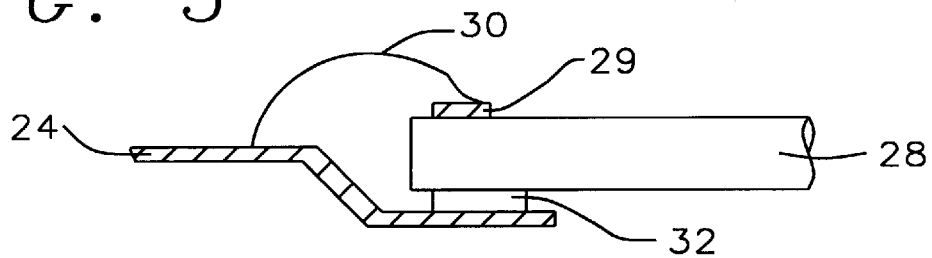
FIG. 6 shows a cross section view of an integrated circuit chip joined to the extended lead frame of this invention taken along line 6—6' of FIG. 5.

Refer now to FIGS. 4–6 for a description of the extended lead frame and method of attaching a chip to the extended lead frame of this invention. FIG. 4 shows a top view of the extended lead frame 20. The extended lead frame has a number of extended leads 24 which will extend under the bottom side of the integrated circuit element or chip when it is attached to the lead frame. The periphery of the space the integrated circuit element will occupy when it is attached is shown by the dotted line 26 in FIG. 4. There can also be a number of shorter leads 22 in the lead frame which will not extend under the bottom side of the integrated circuit element. The extended leads 24 are not necessarily all of the same length and some can extend farther under the bottom side of the integrated circuit element than others.

Next the integrated circuit element 28, having a top side and a bottom side, is attached to the extended lead frame as shown in FIGS. 5 and 6. FIG. 5 shows a top view of the integrated circuit element attached to the extended lead frame. FIG. 6 shows a cross section view, taken along line 6—6' of FIG. 5, of the integrated circuit element attached to the extended lead frame. As shown in FIGS. 5 and 6 the extended leads 24 of the extended lead frame extend under the bottom side of the integrated circuit element 28 and support the integrated circuit element.

As shown in FIG. 6 the extended leads 24 are attached to the bottom side of the integrated circuit element 28 using a bonding material 32. The bonding material 32 is chosen to be a thermal conductor and an electrical insulator. The extended leads 24 contact a relatively large area of the integrated circuit element and provide a good thermal conduction path to remove heat energy from the integrated circuit element 28. The bonding material 32 can be a material such as polyimide tape having an adhesive, such as an epoxy, on one or both sides of the tape. Other electrically non conductive tape having an adhesive such as an epoxy or other adhesive on one or both sides of the tape can also be used. The integrated circuit element 28 is then attached to the extended leads 24 using the bonding material 32 and mechanical pressure, and/or other means such as curing.

Depending on the adhesive used heat energy may also be used to attach the integrated circuit element 28 to the extended leads 24.

The input/output pads 29 of the integrated circuit element 28 are then electrically connected to the extended leads 24 and the shorter leads 22 of the extended lead frame using wire bonds 30 and standard wire bonding techniques. As can be seen in FIG. 6 the extended leads 24 may be bent to extend under the bottom side of the integrated circuit element 28 so that the point of the lead frame to which the wire bonds 30 are attached is in nearly the same plane as the top surface of the integrated circuit element 28.

In this assembly, shown in FIGS. 5 and 6, the wire bonds 30 provide the electrical connection between the leads and the input/output pads 29 of the integrated circuit element or chip 28. The bonding material 32 which attaches the integrated circuit element 28 to the lead frame electrically insulates the leads of the lead frame from the back side of the integrated circuit element. The bonding material 32, being a thermal conductor, provides a thermal path to remove thermal energy from the integrated circuit element 28. The leads, 22 and 24, can be a material such as copper, or the like. The wires forming the wire bonds can be a material such as gold, or the like.

Figure 7:
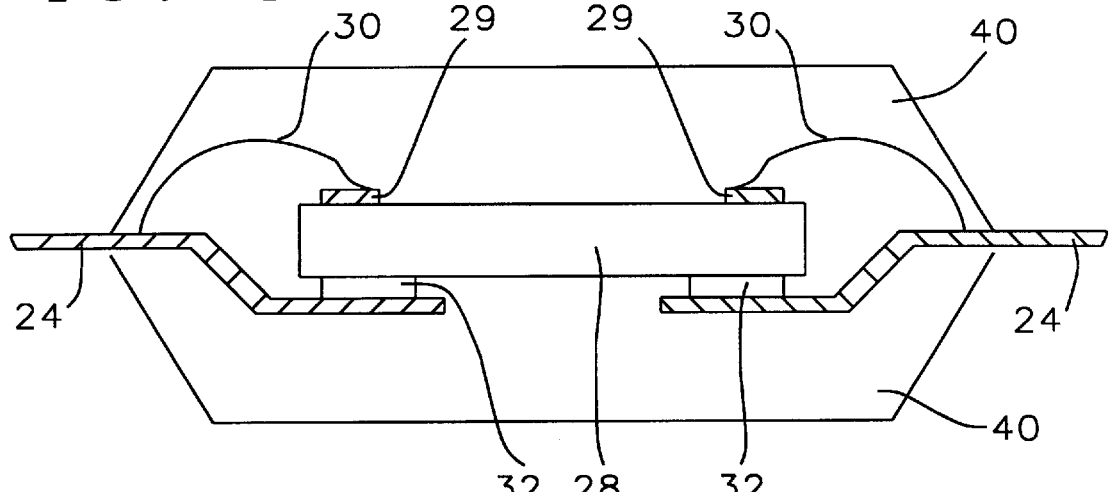
FIG. 7 shows a cross section view of an encapsulated assembly.

Next the assembly can be encapsulated, as shown in FIG. 7. This example shows a plastic package 40 encapsulation however other encapsulation packages can be used. In this invention it is not necessary to rely on the encapsulation 40 to conduct the heat energy away from the integrated circuit element 28 because the extended leads 24 bonded to the back side of the integrated circuit element 28 provide a thermal conduction path.

While the invention has been particularly shown and described with reference to the preferred embodiments thereof, it will be understood by those skilled in the art that various changes in form and details may be made without departing from the spirit and scope of the invention.

What is claimed is:

1. A method of packaging electronic circuits, comprising the steps of:
   providing an integrated circuit element having a first surface, a second surface, and input/output pads on said first surface;
   providing a plurality of first electrically conducting leads and a plurality of second electrically conducting leads, wherein a part of each of said first electrically conducting leads extend under said second surface of said integrated circuit element;
   placing bonding material between said second surface of said integrated circuit element and those parts of said first electrically conducting leads extending under said second surface of said integrated circuit element, wherein said bonding material is a thermal conductor, and an electrical insulator;
   bonding said second surface of said integrated circuit element to those parts of said first electrically conducting leads extending under said second surface of said integrated circuit element using said bonding material, wherein said bonding material contacts said second surface of said integrated circuit element and those parts of said first electrically conducting leads extending under said second surface of said integrated circuit element; and
   forming electrically conductive wire bonds between said input/output pads on said first surface of said integrated circuit element and said first electrically conducting leads and said second electrically conducting leads.

2. The method of claim 1 wherein said bonding material is a thermally conductive and electrically non-conductive tape having adhesive on one or both sides of said tape.

3. The method of claim 1 wherein said bonding material comprises polyimide, epoxy paste, or polyimide and epoxy paste.

4. The method of claim 1 wherein said first electrically conducting leads and said second electrically conducting leads are metal.

5. The method of claim 1 wherein said first electrically conducting leads and said second electrically conducting leads are copper.

6. The method of claim 1 wherein said first electrically conducting leads and said second electrically conducting leads are gold.

7. The method of claim 1 further comprising encapsulating said integrated circuit element, said electrically conductive wire bonds between said input/output pads on said first surface of said integrated circuit element and said first and second electrically conducting leads, said bonding material, and that part of said electrically conducting leads extending under said second surface of said integrated circuit element using encapsulating material.

8. The method of claim 7 wherein said encapsulating material is plastic.

9. The method of claim 1 wherein said electrically conductive wire bonds comprise gold wire.

10. The method of claim 1 wherein said electrically conductive wire bonds comprise aluminum or solder.

* * * * *